United States Patent [19]

Biswas et al.

[11] Patent Number: 5,053,852
[45] Date of Patent: Oct. 1, 1991

[54] MOLDED HYBRID IC PACKAGE AND LEAD FRAME THEREFORE

[75] Inventors: Ranjit Biswas, Westford; Hazen Curtis, III, Andover, both of Mass.

[73] Assignee: AT & T Bell Laboratories, Murray Hill, N.J.

[21] Appl. No.: 548,180

[22] Filed: Jul. 5, 1990

[51] Int. Cl.$^5$ .................. H01L 23/48; H01L 23/28
[52] U.S. Cl. .................. 357/74; 357/72; 357/70
[58] Field of Search .................. 357/70, 68, 74, 72; 174/52.4

[56] References Cited

U.S. PATENT DOCUMENTS

| | | | |
|---|---|---|---|
| 3,902,148 | 8/1975 | Drees et al. | 357/70 |
| 4,400,714 | 8/1983 | Brown | 357/70 |
| 4,482,915 | 11/1984 | Nishikawa et al. | 357/70 |
| 4,496,965 | 1/1985 | Orcutt et al. | 357/70 |
| 4,704,187 | 11/1987 | Fujita | 357/70 |
| 4,827,611 | 5/1989 | Pai et al. | 29/843 |
| 4,870,474 | 9/1989 | Karashima | 357/70 |
| 4,873,615 | 10/1989 | Grabbe | 357/80 |
| 4,876,587 | 10/1989 | Hilton et al. | 357/70 |
| 4,906,802 | 3/1990 | Castleman | 174/52.4 |
| 4,948,645 | 8/1990 | Holzinger et al. | 357/70 |
| 4,951,120 | 8/1990 | Hagiwara et al. | 357/70 |

OTHER PUBLICATIONS

T. Sasamoto et al., "A New Type Hybrid IC in a Transfer-Molded Standard Package", IEEE, Third IEEE/CHMT International Electronic Manufacturing Technology Symposium, Manufacturing Technology-The Competitive Advantage, 10/12-14/87, pp. 16-21.
T. Ozawa et al., "Micro Hybrid Circuits for Surface Mounting Technology", IEEE, Electron. Ind. Assoc., 36th Electronic Components Conference Proceedings, May 5-7, 1986, pp. 10-15.
C. Kurosawa et al., "Molding Compounds and Hybrid Technology", Japanese Hybrids, vol. 3, No. 1, 1989, pp. 19-30.
R. Biswas et al., "Molded Hybrid IC Packages", IEEE, Electron. Ind. Assoc., 1989 Proceedings, 39th Electronic Components Conference, May 22-24, 1989, pp. 729-735.

Primary Examiner—Rolf Hille
Assistant Examiner—S. V. Clark
Attorney, Agent, or Firm—O. E. Alber

[57] ABSTRACT

The present invention is a molded Hybrid Integrated Circuit package in which a carrier substrate with a various circuit elements including an integrated circuit is supported within a resilient cradle formed by down-set and compliant portions of leads arranged in a quad configuration around the periphery of the carrier substrate, with ends of the down-set portions being secured to pads arranged on the periphery of the carrier substrate. Prior to the assembly with carrier substrate and molding of the resultant subassembly, the leads form a part of a lead frame including elongated bar and dambar on each of the quad sides interconnecting end and central portions, respectively, of the leads, and an interconnecting array of connecting links and bridges at the ends of the dam-bars. The lead-frame design, including the down-set and resilient portions of the leads, provides for the stress relief between the carrier substrate and the lead frame, especially during the termo-bond lead attachment and molding of an encapsulating resin around the carrier substrate and leads subassembly.

21 Claims, 4 Drawing Sheets

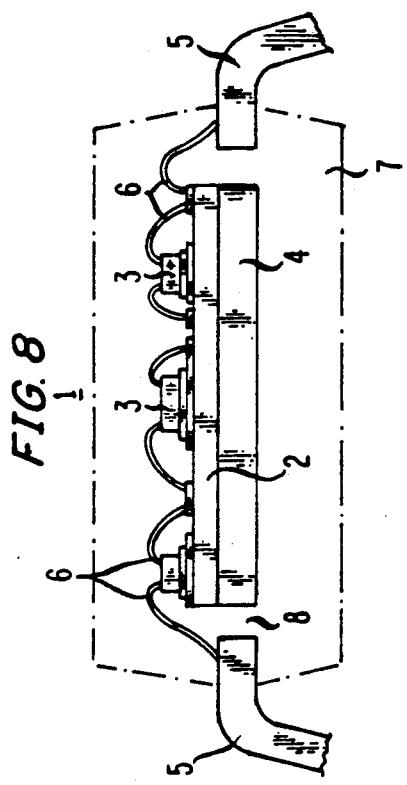
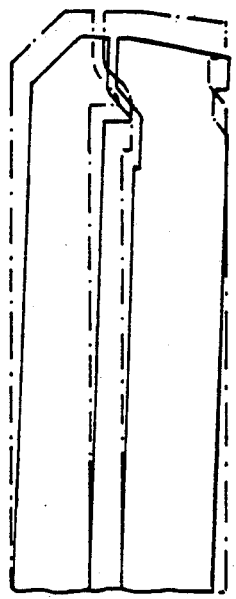
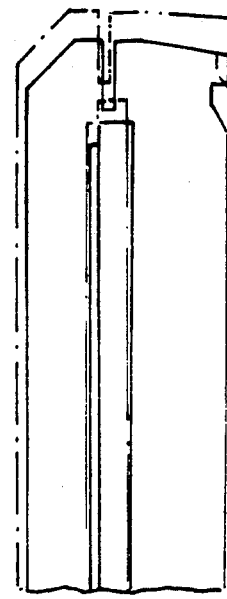
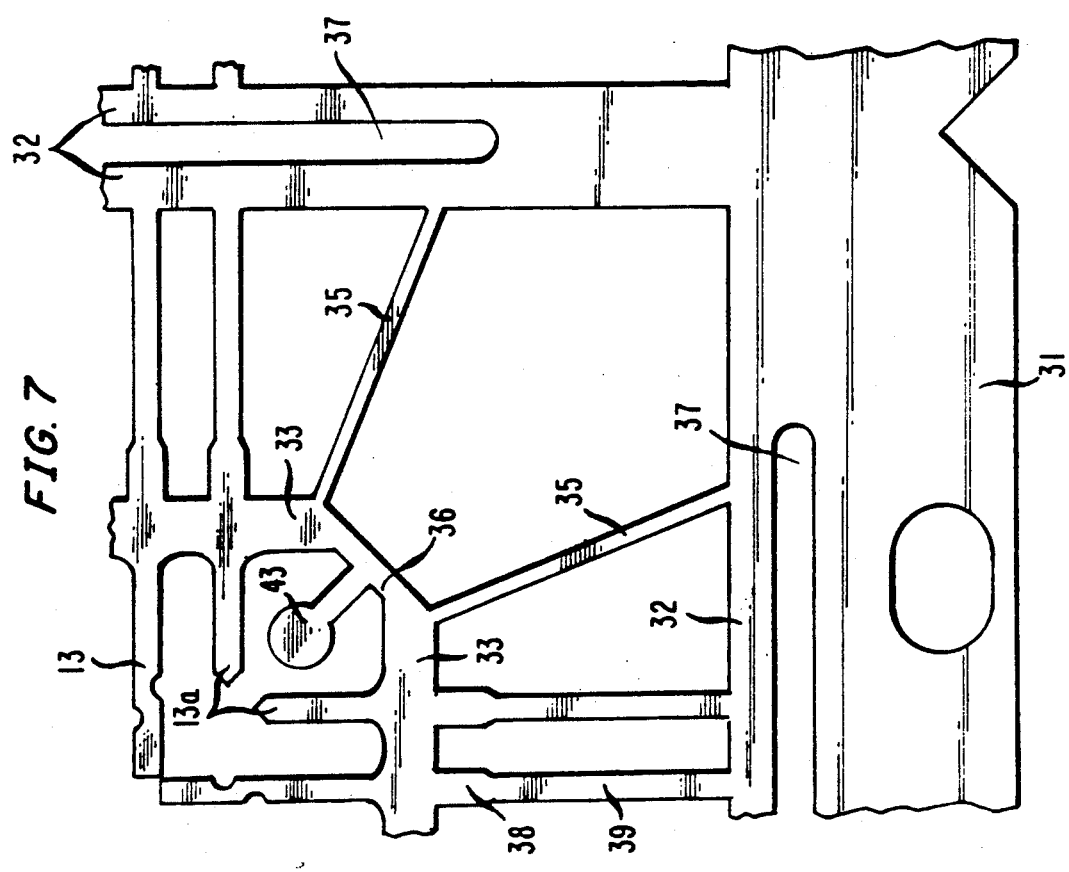

MOLDED HYBRID IC PACKAGE AND LEAD FRAME THEREFORE

TECHNICAL FIELD

This invention concerns with molded hybrid integrated circuit (HIC) package and with a lead frame structure for use in forming the HIC package.

BACKGROUND OF THE INVENTION

Hybrid integrated circuits (HICs) are microelectronic devices which combine several electronic functions on a single substrate and which are relatively large in comparison to integrated circuits (ICs). To protect and prolong the reliability of microelectronic devices, they are often encapsulated (packaged) in a suitable plastic material, such as epoxy. The encapsulation is conducted so as to produce molded packages which are uniform in size and are easy to handle. The main interest lies primarily in small size packages with a large number of peripheral contacts (e.g. in quad form) and in the protection afforded the device by the encapsulating plastic material. Outside dimensions of the molded HIC packages correspond to the sizes standardized by Joint Electron Device Engineering Council (JEDEC); therefore the molded HICs may be used in spaces typically provided for ICs.

Typically, HIC's were packaged utilizing a mounting pad-and-lead frame. A schematic representation of one of such prior art encapsulated HIC package, denominated 1, is shown in crossection in FIG. 8 wherein a carrier substrate 2, such as a ceramic substrate or a printed wiring board, with a plurality of various electronic elements commonly identified as 3, such as resistors, capacitors, transistors, ICs and other elements of a HIC, was mounted on a lead frame comprising a mounting pad 4 and a plurality of leads 5. After wiring connections 6 were made to various devices, pads on the substrate and the leads of the lead frame, the entire assembly was encapsulated in a suitable plastic material, 7, such as epoxy. One variant of such prior art HIC package is disclosed in an article by T. Sasamota, N. Senba, Ohnishi and A. Sato, entitled "A New Type Hybrid IC in a Transfer-molded Standard Package", published in Proc. IEEE Int. Electronic Manufacturing Technology Symp., 1987, pp. 16–21. Unfortunately this type of design leads to thermal stresses during and post molding of the package which may affect the integrity of the wire connections 6 to leads 5, as well as of the molded package. Therefore, it is desirable to provide a molded HIC-design which would eliminate or at least reduce the possibility.

SUMMARY OF THE INVENTION

The present invention is a molded Hybrid Integrated Circuit package in which a carrier substrate with a various circuit elements including an integrated circuit is supported within a resilient craddle formed by down-set and compliant portions of leads arranged in a quad configuration around the periphery of the carrier substrate, with ends of the down-set portions being secured to pads arranged on the periphery of the carrier substrate. Prior to the assembly with carrier substrate and molding of the resultant subassembly, the leads form a part of a lead frame including elongated bar and dam-bar on each of the quad sides interconnecting end and central portions, respectively, of the leads, and an interconnecting array of connecting links and bridges r* the ends of the dam-bars. The lead-frame design, including the down-set and resilient portions of the leads, provides for the stress relief between the carrier substrate and the lead frame, especially during the termo-bond lead attachment and molding of an encapsulating resin around the carrier substrate and leads subassembly.

BRIEF DESCRIPTION OF THE DRAWING

FIG. 7 is a schematic enlarged view of a corner section of the lead frame shown in FIG. 3.

FIG. 8 is a schematic crossectional view of a representative prior art encapsulated HIC package comprising pad-and-lead frame and wire bond lead attachment.

FIG. 9 is a schematic view of a sideview crossection of an encapsulated HIC package with lead bond attachment according to the present invention showing displacement between mold temperature (~170° C.-dashed outline) and room temperature (~25° C.-solid outline).

FIG. 10 is a schematic view of a sideview crossection of a prior-art encapsulated HIC package with wire bond attachment and pad-and-lead frame showing displacement between mold temperature (~170° C.-dashed outline) and room temperature (~25° C.-solid outline).

DETAILED DESCRIPTION

Figure 1:
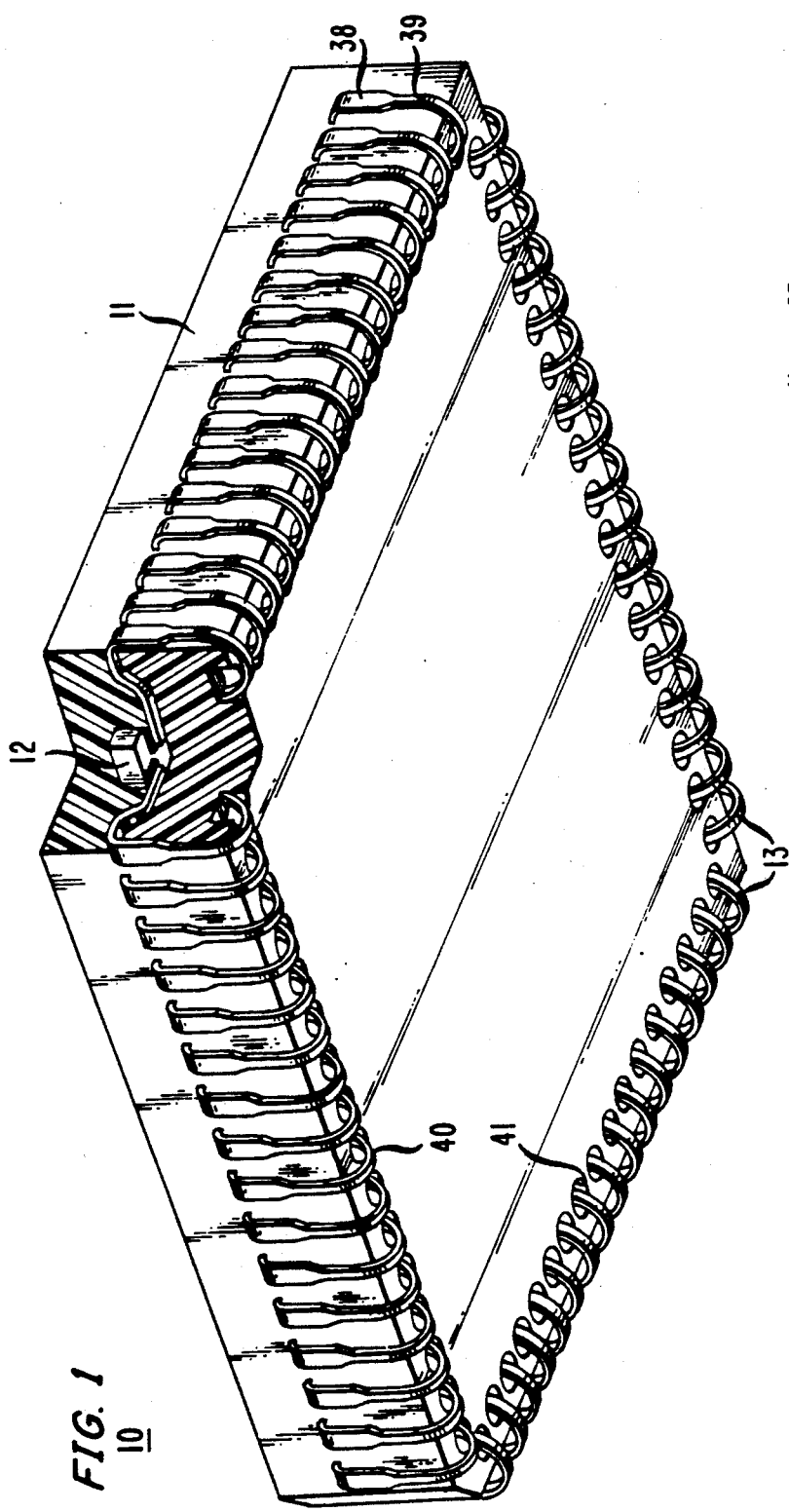
FIG. 1 is a perspective bottom view of an encapsulated HIC package embodying the invention.
Figure 2:
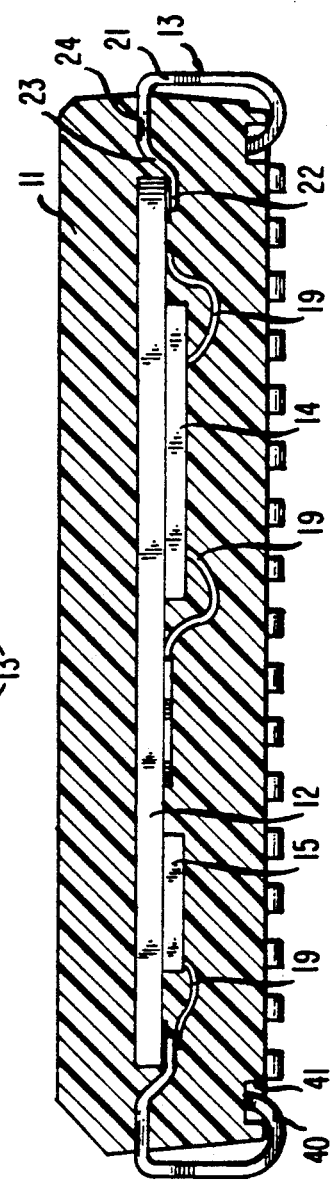
FIG. 2 is a schematic crossectional side view of the HIC package embodying the invention.

FIGS. 1 and 2 illustrate a preferred embodiment of the molded HIC package of the invention. The package, generally designated by reference numeral 10, comprises a molded encapsulating resin, 11, a carrier substrate, 12, and leads, 13, arranged in quad configuration around the carrier substrate. As shown in this embodiment, leads 13 have a "J"-leg configuration, although other configurations, e.g. "L"-leg, can be employed. The resin encompasses the carrier substrate and parts of the leads connected to the substrate and protects various elements of the HIC arranged on the carrier substrate, from damage and the environment.

Figure 6:
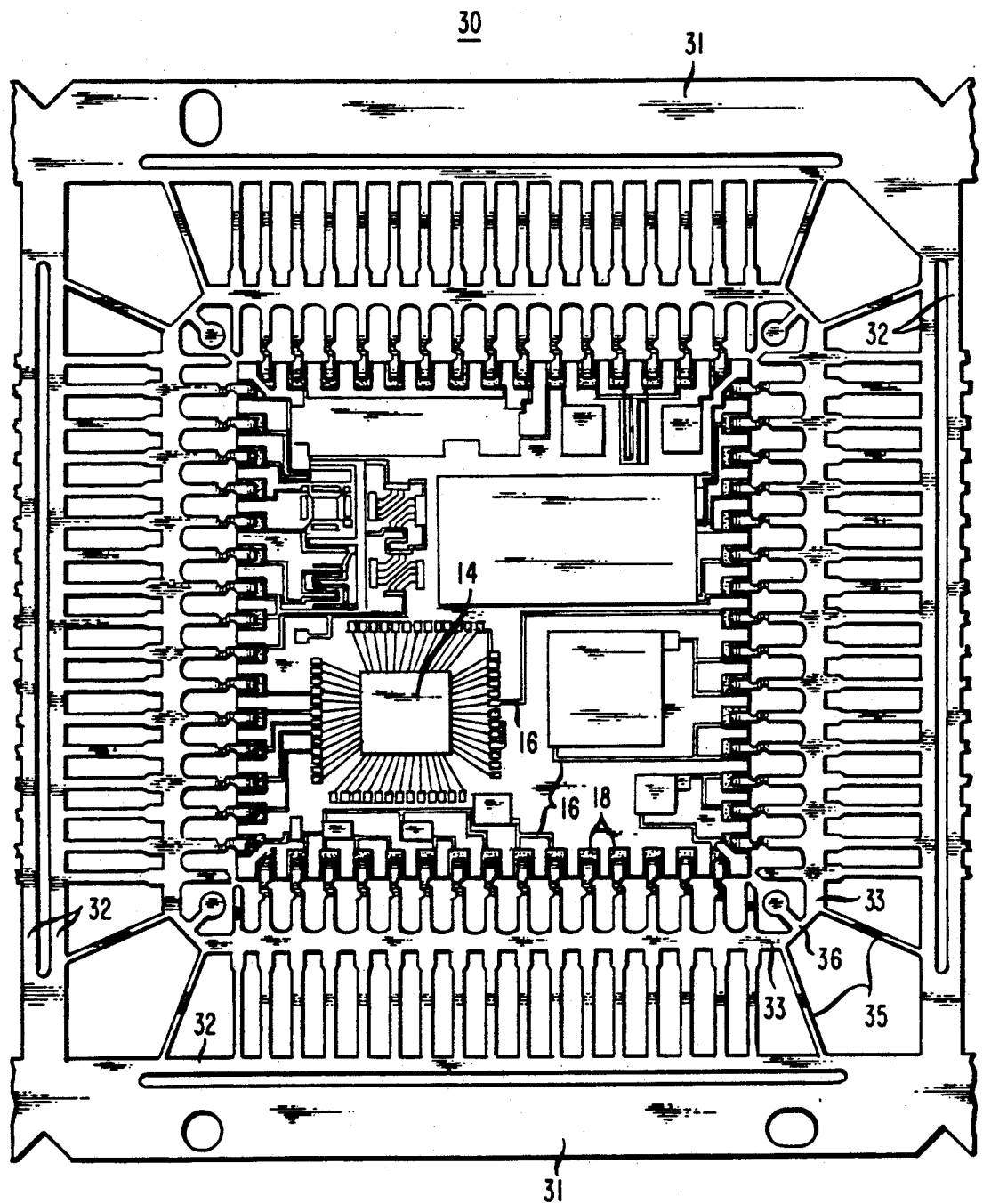
FIG. 6 is a schematic view of the lead frame assembled with a HIC.

One schematic variant of carrier substrate 12 with various elements surface-mounted on the substrate is shown in FIG. 6 prior to the encapsulation. Carrier substrate 12 comprises a flat, relatively thin plate of rigid material, such as, but not limited to, ceramic. A plurality of various HIC elements including at least one IC die 14, capacitors 15, resistors 17 and other elements of a particular HIC are mounted on the carrier substrate. A plurality of conductors 16 for connecting the various elements of the HIC to one another and to a plurality of contact pads 18, are positioned around the periphery of the carrier substrate 12. As is known in the art, conductors 16 can be embedded within the carrier substrate, or built-up layer by layer on the surface of the carrier substrate. Terminal areas on the ICs may be connected to conductors 16 and/or contact pads 18 by gold wire, gold tape or tape like bonds.

A plurality of conductive leads or terminals 13 are spaced in a quad arrangement around the periphery of molded package 10 and comprise ribbon-like members formed of a flexible metal such as copper alloy. Depending on the size of the package, as many as 1,000 or more leads can be used around the periphery spaced as close as 0.01 of an inch (0.026 cm) apart. As shown in FIG. 2, each lead 13 includes an outer portion 21 extending outside the molded resin and an inner portion extending into the molded resin and including a down-set portion 22, a compliant portion 23 and a shoulder portion 24.

An embodiment of a lead frame 30 for use in fabricating the encapsulated HIC according to the present invention is shown in FIGS. 3, 4, 5, 6 and 7 of the drawings. The lead frame may be integrally formed by die stamping or by etching a pattern from a thin strip of conductive material, such as copper, about 0.03 cm (0.01 inch) thick, with a width dependent on the size of the carrier substrate and the quad number of leads in the package. In the preferred embodiment, the conductive material is copper per ASTM B 465 Alloy 194 spring temper and drawn to from 70 to 76 KPS.

The purpose of lead frame 30 is to support electrical conductor leads 13 in spaced relationship prior to and during the assembly with a HIC, whereat tips of leads 13 may be bonded to contact pads 18 (FIG. 6) formed on the surface and arranged around the periphery of carrier substrate 12. The bonding may be accomplished by suitable means including thermocompression (thermobond) or ultrasonic means.

The lead frame 30 forms an integral unit which is composed of an outer frame portion including strips 31 and elongated bars 32 and inner lead frame portion including dam-bars 33 which interconnect inwardly extending leads 13 spaced in quad arrangement around the periphery of the frame. Dam-bars 33 interconnect leads 13 intermediate their free ends and the elongated bars a short distance outside of an area encircled by a dashed profile 34 (FIG. 3) representing an outer boundary of the encapsulant 11. Each end of dam-bar 33 is connected to a link member 35 and to a corner bridge 36. Outwardly facing end portions of leads 13 and link members 35 are connected to narrow elongated bars 32. Bars 32 join wide strips 31 at the corners of lead frame 30. An elongated cutout 37 runs alongside of each bar 32. Cutout 37 separates bars 32 of lead frame 30 thermally and mechanically from the wide strips 31 and also from similar narrow strips 32 of adjacent lead frames on either side of lead frame 30. Each of the cutouts typically extends for a distance lesser than the extent of the lead frame.

Figure 3:
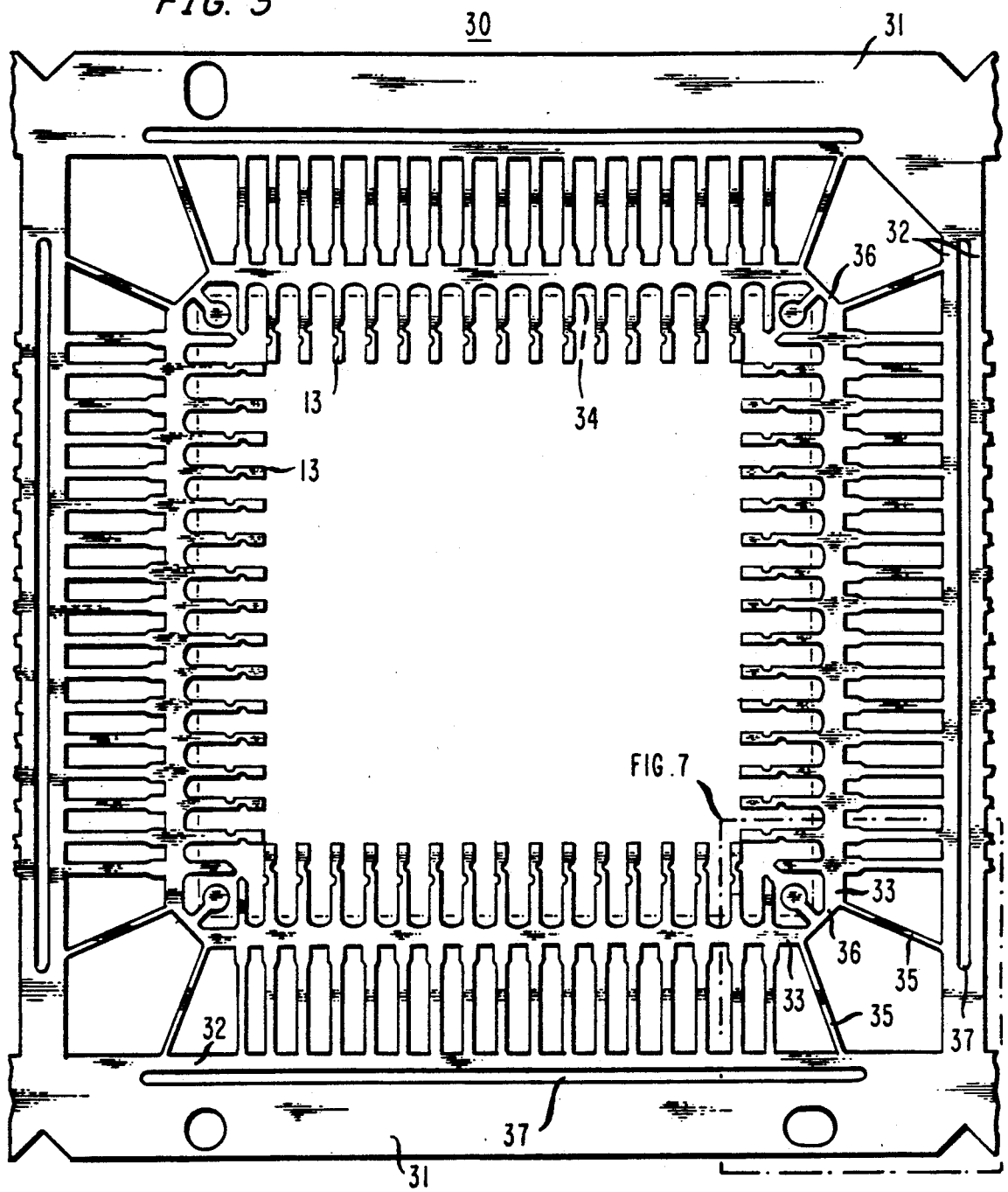
FIG. 3 is a schematic top view of a lead frame embodying the invention prior to its assembly with a HIC.
Figure 4:
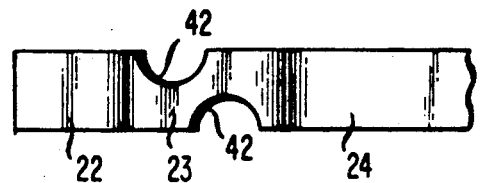
FIGS. 4 and 5 each is a schematic, enlarged top and side view, respectively, of a section of an inner portion of one lead of the lead frame showing the down-set and compliant sections of the lead.
Figure 5:
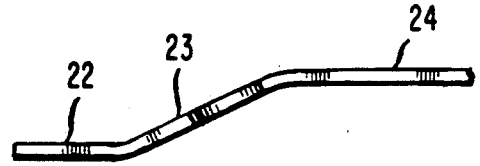

FIG. 3 discloses an intermediate state of lead frame 30 as formed from a flat, elongated strip of metal. A plurality of lead frames may be formed side by side on the strip. In this state, leads 13 are formed such that the inward facing edges of the leads form a centrally located rectangular shaped opening, with an edge of each penultimate lead in a row being in a near vicinity of or even in contact with an edge of a penultimate lead in an adjoining row. An end portion of each last lead 13a in each row is truncated so as to avoid overlap of these leads each with another. The truncated leads also form a stop for respective corners of carrier substrate 12 during the assembly of carrier substrate 12 with the lead frame. As is shown in FIG. 6, the inward facing portions of leads 13 are down-set from the plane of the lead frame preform shown in FIG. 3 so as to form a flat down-set portion 22 and an inclined compliant portion 23 which are dislocated vertically relative to shoulder portion 24 of lead 13 and the remaining plane of the lead frame. (FIGS. 2, 4 and 5).

Down-set portions 22 lay in a plane, which is different from the main plane of the lead frame 30, in a number of ways. In one instance, the down-set portion is depressed to a plane which is below the original flat plane of the lead frame with compliant portion 23 being at an angle to and inter-connecting the down-set portion 22 and the shoulder portion 24 of leads 13. Down-set portions 22 and compliant portions 23 form a cradle within which is placed carrier substrate 12 with the device-carrying surface and contact pads facing down. The size of the craddle is such as to accomodate carrier substrates of sizes, selected such as 1.3 cm (0.5 in) to 3.8 cm (1.5 in) or greater square. The depth of the cradle is, preferably, less than the height (the thickness) of the carrier substrate so that the non-device-carrying surface of the carrier substrate is above the plane of the shoulder portion 23 of the lead 13. In another instance, portions corresponding to the down-set portion 22 and the compliant portion 23 of leads 13 are deformed such that most of the plane of the lead frame either remains at or is depressed down relative to an original main plane of the lead frame 30. The lead frame may then be placed over the carrier substrate such that the free ends of down-set portions of the leads are in overlapping contact with contact pads on the substrate. In still another version the flat frame may be placed over the carrier substrate, with the circuit and the pads facing upwards, and the leads may be deformed in situ so as to form an inverted cradle-like configuration over the carrier substrate.

Each one of leads 13 is provided with a wider section, 38, extending from dam-bar 33 for about 1/10 to ⅓ the distance toward bar 32, and a narrower section, 39, connecting into bar 32. The wider section is provided to remove heat first from carrier substrate 12 during the thermal soldering step and later from inside of the molded plastic shape during and after the molding step.

Compliant portion 23 of each lead 13 permits limited movement of the down-set portion of the lead so as to accommodate stresses formed during the thermal expansion and/or contraction of members of the package during molding and/or thermal cycling in the field. Each compliant portion is provided with notches 42, on opposite sides of the lead 13. The notches are offset each relative to another and impart additional resiliency to the compliant portion.

Lead frame 30 is also provided with a thermally responsive corner section shown in greater detail in FIG. 7 of the drawings. Each corner section is composed of truncated leads 13a, link members 35, bridge 36 and a disk, 43. Link members 35 and bridge 36, which are narrower than narrower section 39 of leads 13, cooperate during the thermal cycle of assembly of the lead frame and the carrier substrate so as to transmit heat away from the inner portions of the assembly and to absorb and equalize stresses resulting from the thermal step.

To assemble lead frame 30 with carrier substrate 12, the carrier substrate is placed into the cradle formed by down-set portions 22 and compliant portions 23 of leads 13 such that contact pads 18 arranged around the periphery of the substrate overlap end portions of leads 13. The end portions of leads 13 and the contact pads are then conductively secured each to another. This may be accomplished by means of conductive adhesive or or by some other means, such as thermo-bonding, thermo-compression bonding, soldering, brazing or other suitable procedures. A convenient way of producing effective electrical connections is by providing either the contact pads 18 or ends of the leads 13 with solder and establishing the connection along all four sides at once by thermal means with a minimum of pressure. Due to the non-rigid compliant nature of the lead frame 30, down-set portion 22 and compliant portion 23 of each lead 13, the leads are directly attached to the pads without any intermediate connections such as wires. Any distortion or warpage of the carrier substrate 12 caused by thermal expansion and contraction or mechanical stresses resulting from thermal connection processing or during the molding step are accommodated by the resilience of the lead frame 30 and inner portions 22 and 23 of leads 13.

Once the down-set portions 22 of leads 13 are in overlapping relation with contact pads 18 on the carrier substrate, this sub-assembly is subjected to a thermode solder reflow process. In this embodiment the subassembly is subjected simultaneously to heat, e.g. around 220° C., to reflow solder on the pads and to moderate pressure to keep the leads in contact with the contact pads, and then to cool-down, still under pressure, to permit the solder to solidify and to secure the contact pads and the leads together. Care should be taken that the pressure is such as not to cause any damage to the carrier substrate.

The subassembly including carrier substrate 12 and lead frame 30 is subjected to a molding operation either at the same station as the soldering step or is passed-on to an encapsulant molding station. A suitable encapsulating resin is molded about subassembly forming the encapsulant 11 of a desired shape to protect the HIC circuitry from damage and environment. The encapsulating resin is typically an epoxy resin, such as Novalac epoxy resin. The molding is typically conducted at relatively low temperatures, such as about 160°-180° C., preferably at, about 170°-175° C.

During the molding cycle (molding and cooling) the sub-assembly is subjected to mechanical strains. Strains are developed because the coefficient of thermal expansion for the materials of the lead frame, carrier substrate, and molding compounds are all different. The lead-frame design provides for the stress relief between the carrier substrate and the lead frame, when the assembly is molded.

After the molding is completed, the lead-interconnecting metal areas including the strips 31, bars 32, dam-bars 33, connecting links 35 and bridges 36 are removed leaving outer portions 21 of leads 13 free outside of mold 11. These portions are then bent into a desired configuration. In the preferred embodiment, the leads are in a "J-form" with an end, 40, of each lead being enclosed within its private well 41. This arrangement reduces the possibility of damage to and dislocation and misalignment of the ends of the leads during further assembly of the molded HICs into larger circuits.

The lead frame design of this invention is a significant improvement over prior art designs such as disclosed in FIG. 8, wherein the integrated circuit is connected to leads 5 by means of wire bonds 6. During the encapsulation and in a field use involving sizable temperature differences e.g. from −40° C. to 175° C., gap 8 between the circuit on the substrate and the lead frame is variable resulting in severe stress gradients due to thermal variations encountered in the manufacturing process. A primary cause of these stresses is the die-paddle 4 required in the prior-art lead-frame to support and position carrier substrate 2. Die-paddle 4 does not permit the molding compound to adhere to the non-component side of the carrier substrate 2 and results in uneven internal stresses in the molded assembly, creating conditions for gold wire failures. In contrast, the leads in the design in accordance with the present invention are attached directly to the carrier substrate, forming a cradle for the substrate and functioning as reinforcing members bearing the stresses, with compliant sections 23 taking up and relieving the strain on the structure. The differences in the action of stress forces on the molded package may be appreciated from the drawings wherein FIGS. 9 and 10 show a schematic representation of each molded assembly at the end of a molding procedure (dash-and-dot) at temperatures of about 175° C. and at the end of the cool-down to room (solid lines) temperature (about 25° C.). One may envision the stresses being applied onto wires, shown in FIG. 8, during the encapsulating cycle causing damage or even breakage of the connections and wires. In contrast, bonds between leads 13 and contact pads 18 remain intact due to the nature of deformation of the assembly and absorption of the stresses by the resiliency of compliant section 23 of the leads. A similar effect would arise when the finished article would be subjected to the temperature cycling in the field use.

We claim:

1. A molded circuit package, which comprises
a carrier substrate, a plurality of leads arranged in a quad configuration around and supporting the carrier substrate, and an encapsulating material molded about the substrate and portions of the leads forming a hermetically sealed package,
the carrier substrate having various elements of a circuit thereon and conductive pads arranged around the periphery of the substrate,
an inner end portion of each lead in said plurality of leads being in contact with a corresponding conductive pad on the substrate,
each lead having an inwardly facing down-set portion including the inner end portion and laying in one plane, an outwardly facing shoulder portion laying in another plane substantially parallel to said one plane, and a compliant portion slanting away from the down-set portion and connecting said down-set and shoulder portions at an angle to each of said planes, said angle being other than a right angle, at least said down-set portions and said compliant portions forming a resilient cradle-like receptacle within which rests the carrier substrate, said substrate being supported within said craddle-like receptacle only by the down-set portions of the leads, and
the encapsulating material is molded about the carrier substrate and the leads after preassemblying the carrier substrate and the leads such that only a part of each shoulder portion projects from the encapsulating material, said encapsulating material hermetically sealing the carrier substrate and encapsulated portions of the leads against the environment.

2. The molded circuit package of claim 1, in which the compliant portion of each lead includes notches in opposite edges of the compliant portion imparting further resiliency to the encapsulated portions of each lead portion so as to allow absorption of thermally-induced stresses.

3. The molded circuit package of claim 2, in which said notches are offset relative each to another.

4. The molded circuit package of claim 1, in which each lead includes an outer lead portion joined with said shoulder portion.

5. The molded circuit package of claim 4, in which said outer lead portion has a J-lead configuration.

6. The molded circuit package of claim 1, in which said encapsulating material comprises epoxy resin.

7. The molded circuit package of claim 1, in which, prior to its assembly with the carrier substrate, said plurality of leads forms a part of a lead frame comprising a relatively rigid outer frame, and a plurality of elongated conductor leads extending inwardly of the lead frame, each lead being supported at one end within the lead frame and having a free inner end for bonding to the substrate, said shoulder portion of each lead being in the plane of the frame, said down-set portion being in a plane which is offset substantially parallel to the plane of the frame, and said compliant portion interconnecting the down-set portion and the shoulder portion at an angle to each of them, said angle being other than a right angle.

8. The molded circuit package of claim 7, in which said outer frame comprises elongated bars interconnecting the outer ends of the leads, said elongated bars are attached at each end to the outer frame, the leads on each side of the frame extend substantially perpendicular to the elongated bars.

9. The molded circuit package of claim 8, in which said frame further comprises straight dam-bars interconnecting the leads intermediate the free inner ends thereof and the respective elongated bars, a short bridge interconnecting each dam-bar to the dam-bar on an adjacent side of the frame, said bridge forming a corner at an angle to each dam-bar, and a link member at each end of the bridge interconnecting each dam-bar to a respective elongated bar and being at an angle to both of them.

10. The molded circuit package of claim 9, in which said bridge and said link members at each corner of the frame cooperate resiliently in absorbing thermally-induced stresses resulting from a step of thermo-bonding free inner ends of the leads to the substrate.

11. The molded circuit package of claim 8, in which said elongated bars are separated from an adjacent outer frame by elongated cutouts arranged parallel to the elongated bars.

12. The molded circuit package of claim 8, in which a reinforcing outer strip common to a plurality of lead frames, is arranged adjacent to the elongated bars on two opposite sides of the lead frame.

13. The molded circuit package of claim 9, in which, after molding, the outer ends of the leads are freed by removal of said dam-bars, elongated bars, bridges, link members and reinforcing outer strips.

14. A lead frame for use in molded circuit packages, in which electrical conductor leads are formed integrally with the lead frame in a spaced apart relationship each to another, which comprises a relatively rigid outer frame, and a plurality of elongated conductor leads extending inwardly of the lead frame, each lead being supported at one end within the lead frame and having a free inner end at another end of the lead for bonding to a substrate, the free inner ends of the leads defining a centrally located window, each lead having a down-set portion including said free inner end, a shoulder portion, a compliant portion interconnecting the down-set and the shoulder portions, and an outer portion, said down-set portion and said shoulder portion being at different parallel planes, said shoulder portion being in the plane of the frame and said downset portion being in a plane which is off-set substantially parallel to the plane of the frame, said compliant portion interconnecting the down-set portion and the shoulder portion at an angle to the parallel planes, said angle being other than a right angle, and the down-set portion and the compliant portion of the leads in the frame forming a resilient cradle-like support for the substrate.

15. A lead frame of claim 14, in which said compliant portion of each lead includes notches at opposite edges of the compliant portion imparting further resiliency to the down-set portion so as to allow absorption of thermally-induced stresses.

16. A lead frame of claim 15, in which said notches are offset relative each to another.

17. A lead frame of claim 14, in which said bridge and said links at each corner of the frame are designed to resiliently cooperate in removing thermally-induced stresses resulting from a step of thermo-bonding free ends of the leads to the substrate.

18. A lead frame of claim 14, in which
said outer frame comprises elongated bars interconnecting the outer ends of the leads, said elongated bars being attached at each end to the outer frame, and the leads extend substantially perpendicular to the elongated bars.

19. A lead frame of claim 14, in which
said frame comprises straight dam-bars interconnecting the leads intermediate the free inner ends of the leads and respective elongated bars, a short bridge at each corner of the lead frame interconnecting adjacent dam-bars, said bridge being at an angle to the adjacent dam-bars, and link members at each side said corner interconnecting each dam-bar to a respective straight strip and being at an angle to them.

20. A lead frame of claim 18, in which
a reinforcing outer strip common to a plurality of lead frames is arranged adjacent to the elongated bars on two opposite sides of the lead frame.

21. A lead frame of claim 18, in which said elongated bars are separated from adjacent outer frame by elongated cut-outs arranged parallel to the elongated bars.

* * * * *